(12) United States Patent
Yasuda et al.

(10) Patent No.: US 12,294,369 B2
(45) Date of Patent: May 6, 2025

(54) ASYMMETRICAL CLOCK SEPARATION AND STAGE DELAY OPTIMIZATION IN SINGLE FLUX QUANTUM LOGIC

(71) Applicant: International Business Machines Corporation, Armonk, NY (US)

(72) Inventors: Takeo Yasuda, Nara (JP); Robert K. Montoye, Yorktown Heights, NY (US); Gerald W. Gibson, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 17/729,614

(22) Filed: Apr. 26, 2022

(65) Prior Publication Data
US 2023/0344432 A1 Oct. 26, 2023

(51) Int. Cl.
*H03K 19/195* (2006.01)
*G06F 1/06* (2006.01)
(Continued)

(52) U.S. Cl.
CPC .............. *H03K 19/195* (2013.01); *G06F 1/06* (2013.01); *H03K 5/01* (2013.01); *H03K 2005/00078* (2013.01)

(58) Field of Classification Search
CPC ................... H03K 19/195; H03K 5/01; H03K 2005/00078; G06F 1/06
See application file for complete search history.

(56) References Cited

U.S. PATENT DOCUMENTS 5,077,686 A * 12/1991 Rubinstein ................ G06F 1/08
377/47
5,371,417 A * 12/1994 Mirov ....................... G06F 1/06
327/295
(Continued)

FOREIGN PATENT DOCUMENTS

| JP | 3936889 B2 | 6/2007 |
|---|---|---|
| JP | 4402136 B2 | 1/2010 |
| WO | 2004102628 A2 | 11/2004 |

OTHER PUBLICATIONS

Johnson, Kevin, "Design and implementation of an asynchronous version of the MIPS R3000 microprocessor", Jan. 1994, Rochester Institute of Technology, pp. 2-4 (Year: 1994).*
(Continued)

*Primary Examiner* — Faisal M Zaman
(74) *Attorney, Agent, or Firm* — SCULLY, SCOTT, MURPHY & PRESSER, P.C.; Erik Johnson (57) ABSTRACT

Systems and methods for optimizing a pipeline are described. A system can generate at least one pair of single flux quantum (SFQ) clock signals based on a stream of SFQ pulses. Each pair of SFQ clock signals can include a first SFQ clock signal and a second SFQ clock signal that is out of phase with the first SFQ clock signal. The second SFQ clock signal can have the same frequency as the first SFQ clock signal. The system can define, for each pair of SFQ clock signals, a first clock cycle and a second clock cycle based on the first SFQ clock signal and the second SFQ clock signal. The second clock cycle can be greater than the first clock cycle. The system can assign the first and second clock cycles to different stages of a pipeline based on delays by the different stages.

20 Claims, 8 Drawing Sheets

(51) Int. Cl.
 *H03K 5/00* (2006.01)
 *H03K 5/01* (2006.01)

(56) References Cited

U.S. PATENT DOCUMENTS

| | | | | |
|---|---|---|---|---|
| 6,281,728 | B1* | 8/2001 | Sung | H03L 7/081 327/158 |
| 6,404,247 | B1* | 6/2002 | Wang | H03L 7/089 327/158 |
| 6,750,794 | B1* | 6/2004 | Durand | H03M 1/62 341/143 |
| 6,759,974 | B1* | 7/2004 | Herr | H03K 5/135 341/51 |
| 6,922,066 | B2 | 7/2005 | Hidaka | |
| 7,786,786 | B2 | 8/2010 | Kirichenko | |
| 8,023,605 | B2* | 9/2011 | Tsukamoto | H04L 7/0338 327/1 |
| 8,250,395 | B2 | 8/2012 | Carter et al. | |
| 8,327,158 | B2 | 12/2012 | Titiano et al. | |
| 8,476,962 | B2 | 7/2013 | Pelley | |
| 8,516,426 | B2 | 8/2013 | Bose et al. | |
| 9,646,682 | B1* | 5/2017 | Miller | G11C 7/06 |
| 9,710,586 | B2 | 7/2017 | Muller et al. | |
| 9,733,978 | B2 | 8/2017 | Suarez et al. | |
| 9,876,505 | B1* | 1/2018 | Dai | H03K 19/195 |
| 9,998,122 | B2 | 6/2018 | Hamilton et al. | |
| 10,069,410 | B1 | 9/2018 | Chang et al. | |
| 10,222,416 | B1 | 3/2019 | Inamdar et al. | |
| 10,529,437 | B2* | 1/2020 | Jang | G11C 29/14 |
| 10,599,481 | B2 | 3/2020 | Pistol et al. | |
| 10,651,808 | B2 | 5/2020 | Egan et al. | |
| 10,658,335 | B2 | 5/2020 | Gu et al. | |
| 10,680,617 | B2 | 6/2020 | Rylov | |
| 10,726,351 | B1* | 7/2020 | Li | G06N 10/00 |
| 10,795,853 | B2 | 10/2020 | Nassif et al. | |
| 10,950,299 | B1 | 3/2021 | Mukhanov et al. | |
| 11,137,822 | B2 | 10/2021 | Gelman et al. | |
| 2002/0060635 | A1* | 5/2002 | Gupta | H03M 1/14 341/133 |
| 2003/0016069 | A1* | 1/2003 | Furuta | H03K 17/92 327/367 |
| 2004/0042255 | A1* | 3/2004 | Labrum | H03K 5/1565 365/149 |
| 2004/0179421 | A1* | 9/2004 | Kim | G11C 29/12015 365/233.1 |
| 2005/0036254 | A1 | 1/2005 | Premerlani et al. | |
| 2005/0047245 | A1* | 3/2005 | Furuta | G11C 7/06 365/222 |
| 2005/0270870 | A1* | 12/2005 | Shin | H04Q 11/0421 365/202 |
| 2006/0288196 | A1* | 12/2006 | Unsal | G06F 9/3861 712/E9.06 |
| 2006/0290553 | A1* | 12/2006 | Furuta | H03K 3/38 341/155 |
| 2007/0064135 | A1* | 3/2007 | Brown | H04N 25/745 348/E3.018 |
| 2009/0160492 | A1* | 6/2009 | Hailu | G06F 1/08 327/407 |
| 2010/0127679 | A1* | 5/2010 | Satterfield | G06F 1/06 327/76 |
| 2010/0229034 | A1* | 9/2010 | Kanaya | G06F 11/1604 714/10 |
| 2010/0295584 | A1* | 11/2010 | Sano | H03L 7/0991 327/145 |
| 2012/0007638 | A1* | 1/2012 | Meng | G06F 1/06 327/115 |
| 2013/0305078 | A1* | 11/2013 | Lee | G06F 1/08 713/500 |
| 2014/0266327 | A1 | 9/2014 | Ancis et al. | |
| 2017/0097655 | A1* | 4/2017 | Jeon | G06F 1/10 |
| 2020/0044632 | A1* | 2/2020 | Powell, III | H03K 19/195 |
| 2021/0081209 | A1 | 3/2021 | Meswani et al. | |
| 2021/0208803 | A1 | 7/2021 | Myers et al. | |
| 2021/0226635 | A1 | 7/2021 | Mukhanov et al. | |
| 2021/0271288 | A1* | 9/2021 | Seo | H03L 7/07 |
| 2022/0021391 | A1* | 1/2022 | Pasandi | G06N 10/00 |
| 2022/0094339 | A1* | 3/2022 | Kim | H03K 5/01 |
| 2022/0255541 | A1* | 8/2022 | Zlotnik | H03K 3/0375 |

OTHER PUBLICATIONS

C. Fourie, "Single Flux Quantum Circuit Technology and CAD overview," 2018 IEEE/ACM International Conference on Computer-Aided Design (ICCAD), 2018, pp. 1-6, doi: 10.1145/3240765.3243498.

P. Yuh, "A 512-bit shift register using compact two-phase single flux quantum clock generators with large margins and low power," in IEEE Transactions on Applied Superconductivity, Dec. 1993, pp. 3116-3118, vol. 3, No. 4, doi: 10.1109/77.251814.

G. Pasandi, A. Shafaei and M. Pedram, "SFQmap: A Technology Mapping Tool for Single Flux Quantum Logic Circuits," 2018 IEEE International Symposium on Circuits and Systems (ISCAS), 2018, pp. 1-5, doi: 10.1109/ISCAS.2018.8351603.

A. Chattopadhyay and Z. Zilic, "Flexible and Reconfigurable Mismatch-Tolerant Serial Clock Distribution Networks," in IEEE Transactions on Very Large Scale Integration (VLSI) Systems, Mar. 2012, pp. 523-536, vol. 20, No. 3, doi: 10.1109/TVLSI.2011.2104982.

List of IBM Patents or Patent Applications Treated as Related, filed herewith, 2 pages.

Montoye, R.K., et al., Stacked, Reconfigurable Co-Regulation of Processing Units for Ultra-Wide DVFS, U.S. Appl. No. 17/729,638, filed Apr. 26, 2022, 76 pages.

Bunyk Paul. "RSFQ Subsystem for Petaflops-Scale Computing: "COOL-0"." SUNY Stony Brook, Jan. 1999. pp. 1-7.

Feldman Marc J. "Josephson Junction Digital Circuits—Challenges and Opportunities." FED Report, Feb. 1998. pp. 1-22.

Filippov et al., "20 GHz operation of an asynchronous wave-pipelined RSFQ arithmetic-logic unit," Physics Procedia, 2012, pp. 59-65, vol. 36.

Filippov et al., "8-bit asynchronous wave-pipelined RSFQ arithmetic-logic unit," IEEE Transactions On Applied Superconductivity, 2011, pp. 847-851, vol. 21, No. 3.

Fujimaki, et al. "Large-scale integrated circuit design based on a Nb nine-layer structure for reconfigurable data-path processors." IEICE Trans> Electron., Mar. 2014. pp. 157-165, vol. E97-C, No. 3.

Hirsch J. E. et al., "What is the speed of the supercurrent in superconductors?" arXiv: 1605.09469v4, Jul. 2016. pp. 1-15.

Jabbari et al. "H-tree clock synthesis in RSFQ circuits", In2020 17th Biennial Baltic Electronics Conference (BEC), IEEE, Oct. 6, 2020 (pp. 1-5).

Kito et al. "Rapid Single-Flux-Quantum Truncated Multiplier Based on Bit-Level Processing" IEICE Trans. Electron, Jul. 2019. pp. 607-611, vol. E102-C, No. 7.

Likharev et al., "RSFQ Logic/Memory Family: A New Josephson-Junction Technology for Sub-Terahertz-Clock-Frequency Digital Systems." IEEE Transactions on applied Superconductivity, Mar. 1991, pp. 1-26, vol. I, No. 1.

Mukhanov et al. "New elements of the RSFQ logic/memory family (part 1),". 3rd ISEC Extended Abstracts, (Glasgow, UK), Aug. 1991, pp. 196-199.

Mukhanov, et al. "New elements of the RSFQ logic family." IEEE Trans. Magnetics, Mar. 1991, pp. 2436-2438, vol. 27, No. 2.

NSA, "Superconducting Technology Assessment", Aug. 2005. pp. 1-257.

Osman, et al. "Simplified Josephson-junction fabrication process for reproducibly high-performance superconducting qubits." arXiv:2011.05230v1. Nov. 2020. pp. 1-6.

Takagi, et al., "Circuit description and design flow of superconducting SFQ logic circuits." IEICE Trans. Electron, Mar. 2014. pp. 149-156, vol. E97-C, No. 3.

Wittie et al. "CNET: Design of an RSFQ switching network for petaflops-scale computing", IEEE transactions on applied superconductivity, Jun. 1999, pp. 4034-4039, vol. 9, No. 2.

\* cited by examiner

ASYMMETRICAL CLOCK SEPARATION AND STAGE DELAY OPTIMIZATION IN SINGLE FLUX QUANTUM LOGIC

STATEMENT REGARDING FEDERALLY SPONSORED RESEARCH OR DEVELOPMENT

This invention was made with Government support under Contract No.: W911NF-14-C-0090 awarded by Army Research Office (ARO/ARMY). The Government has certain rights in this invention.

BACKGROUND

The present disclosure relates in general to systems and methods for generating asymmetrical clock signals for single flux quantum (SFQ) circuits and optimizing pipeline stages in SFQ circuits.

In Single Flux Quantum (SFQ) logic, information is stored in the form of magnetic flux quanta and transferred in the form of SFQ voltage pulses. Devices that implement SFQ logic use superconducting devices, such as Josephson Junction (JJ) devices, to process digital signals. An SFQ voltage pulse is produced when magnetic flux through a superconducting loop containing a JJ device changes by one flux quantum as a result of the junction switching. SFQ logic expresses 1 and 0 with a detection of whether an SFQ exists or not in superconductor circuit loops that include the JJ devices. SFQ logic requires a clock input for read and write operations. With the clock signal, for read operation, an SFQ voltage pulse is generated at the output of SFQ gate in state "1" and no SFQ voltage pulse is generated at the output of SFQ gate in state "0".

SUMMARY

In one embodiment, an apparatus for generating asymmetrical clock signals is generally described. The apparatus can include an integrated circuit. The integrated circuit can be configured to receive a stream of single flux quantum (SFQ) pulses. The integrated circuit can be further configured to generate at least one pair of SFQ clock signals based on the stream of SFQ pulses. Each pair of SFQ clock signals can include a first SFQ clock signal and a second SFQ clock signal that is out of phase with the first SFQ clock signal. The second SFQ clock signal can have same frequency as the first SFQ clock signal. The integrated circuit can be further configured to output at least one pair of SFQ clock signals to a processor implementing a pipeline.

In another embodiment, a system for optimizing a pipeline is generally described. The system can include a processor configured to implement a pipeline. The processor can be further configured to receive at least one pair of SFQ clock signals. Each pair of SFQ clock signals can includes a first SFQ clock signal and a second SFQ clock signal that is out of phase with the first SFQ clock signal. The second SFQ clock signal can have same frequency as the first SFQ clock signal. For each pair of SFQ clock signals, the processor can be configured to define a first clock cycle based on a delay from the first SFQ clock signal to the second SFQ clock signal. For each pair of SFQ clock signals, the processor can be configured to define a second clock cycle based on a delay from the second SFQ clock signal to the first SFQ clock signal of a next pair of SFQ signals. The second clock cycle can be greater than the first clock cycle. The processor can be further configured to assign the first clock cycle and the second clock cycle to different stages of the pipeline. The assignment can be based on an amount of delay incurred by the different stages.

In another embodiment, a method for optimizing a pipeline is generally described. The method can include generating at least one pair of SFQ clock signals based on a stream of SFQ pulses. Each pair of SFQ clock signals can include a first SFQ clock signal and a second SFQ clock signal that is out of phase with the first SFQ clock signal. The second SFQ clock signal can have same frequency as the first SFQ clock signal. The method can further include, for each pair of SFQ clock signals, defining a first clock cycle based on a delay from the first SFQ clock signal to the second SFQ clock signal. The method can further include, for each pair of SFQ clock signals, defining a second clock cycle based on a delay from the second SFQ clock signal to the first SFQ clock signal of a next pair of SFQ clock signals. The second clock cycle can be greater than the first clock cycle. The method can further include assigning the first clock cycle and the second clock cycle to different stages of a pipeline. The assignment can be based on an amount of delay incurred by the different stages.

Further features as well as the structure and operation of various embodiments are described in detail below with reference to the accompanying drawings. In the drawings, like reference numbers indicate identical or functionally similar elements.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following descriptions, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

In an aspect, SFQ logic can provide a relatively high energy efficiency due to the size of SFQ voltage pulses being relatively small (e.g., duration in the picosecond scale). However, the delay of wires connecting SFQ devices with one another can be relatively large compared to the delay of SFQ gates. For example, in gate level pipelines being implemented by SFQ logic gates, a transition from one pipeline stage to another pipeline stage can include having a SFQ voltage pulse travel through wires connecting different SFQ logic gates, and these wires can incur delays. Further, the incurred delays can be inconsistent. For example, a delay resulting from a transition from a first pipeline stage to a second pipeline stage can be greater than a delay resulting from a transition from the second pipeline stage to a third pipeline stage. Under this inconsistency, if a single clock is being used by all stages of the gate level pipeline, then the frequency of the clock needs to be at a level that is low enough to accommodate the longer delay stages. However, a lower frequency clock may be sufficient for the shorter delay stages and performance of the circuit may degrade. The usage of one low frequency clock for both long and short stages can impact operation speed of the gate level pipeline, such as longer processing times and increased energy usage.

Figure 1:
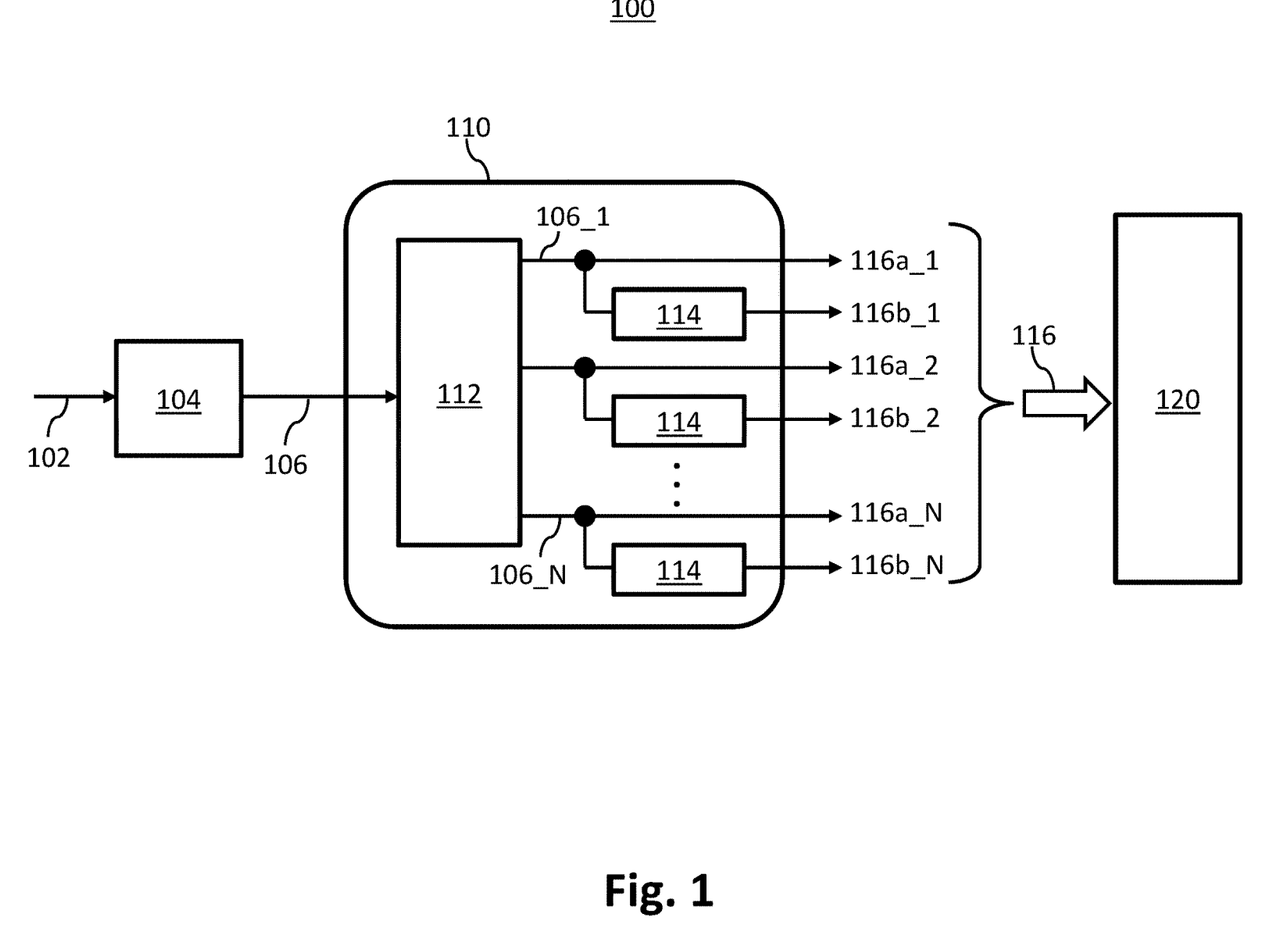
FIG. 1 is a block diagram of an example system for asymmetrical clock separation and stage delay optimization in SFQ logic in one embodiment.

FIG. 1 is a block diagram of an example system 100 for asymmetrical clock separation and stage delay optimization in SFQ logic in one embodiment. System 100 can be implemented in a computing device such as a desktop computer, a laptop, a server, a quantum computer, and/or other suitable computing device. System 100 can include a direct current to single flux quantum (DC/SFQ) converter 104, an integrated circuit 110, and a processor 120. DC/SFQ converter 104 can be configured to receive a direct current (DC) signal 102 and convert DC signal 102 into a base clock signal 106. In one embodiment, DC signal 102 can be a complementary metal-oxide semiconductor (CMOS) level digital clock signal generated by a signal generator or a clock generator. In one embodiment, base clock signal 106 can be a stream of SFQ voltage pulses having a constant frequency.

Integrated circuit 110 can include clock drivers and splitters configured to drive and split or divide base clock signal 106 into a plurality of SFQ clock signals 116. Integrated circuit 110 can include at least one driver, such as a driver 112, configured to receive base clock signal 106 and output N copies of base clock signal 106, labeled as 106_1 to 106_N. Integrated circuit 110 can distribute and split each copy of base clock signal 106 into a pair of SFQ clock signals to generate N pairs of SFQ clock signals 116. In one embodiment, each copy of base clock signal 106 can be directly outputted as a SFQ clock signal to processor 120, and can also undergo a delay 114 to be outputted as a delayed SFQ clock signal. For example, a copy of base clock signal 106_1 can be provided to an output pin of integrated circuit 110 to be outputted as a SFQ clock signal 116a_1, and also undergo delay 114 before being outputted as a delayed SFQ clock signal 116b_1. In one embodiment, delay 114 can be implemented by a Josephson transmission line (JTL).

In the example shown in FIG. 1, a first pair of SFQ clock signal 116 can be 116a_1 and 116b_1, and an N-th pair of SFQ clock signal 116 can be 116a_N and 116b_N. Each SFQ clock signal among SFQ clock signals 116 can be a stream of SFQ voltage pulses having same constant frequency as base clock signal 106. Each pair of SFQ clock signal can have the same constant frequency with one another, but are asymmetrical (e.g., out of phase) with one another due to the application of delay 114 on each copy of base clock signal 106. In one embodiment, driver 112 of integrated circuit 110 can be implemented by an H-tree clock distribution network. The base clock signal 106 can be distributed from a root to a leaf of the H-tree clock distribution network such that the separation of a single-phase clock (e.g., base clock signal 106) occurs at the leaf end (e.g., the output side) to avoid adding distribution skew to the separation delay.

Integrated circuit 110 can provide SFQ clock signals 116 to processor 120. Processor 120 can be a processing element, such as a central processor unit (CPU), a processor core, a microprocessor, and/or other types of processing elements. In one embodiment, processor 120 can include a plurality of SFQ circuits, including SFQ logic gates, configured to perform digital logic operations. To be described in more detail below, processor 120 can receive SFQ clock signals 116 and define asymmetrical clock cycles based on SFQ clock signals 116. For example, processor 120 can use SFQ clock signal 116 to define a short clock cycle and a long clock cycle, where the long clock cycle has a longer time period. SFQ circuits in processor 120 can be used for implementing a pipeline, and processor 120 can categorize stages of the pipeline into different categories. For example, processor 120 can categorize each stage of the pipeline into a first delay stage (e.g., which can also be referred to as a short delay stage) or a second delay stage (e.g., which can also be referred to as a long delay stage), where the second delay stage can incur more delay or latency than the first delay stage. Processor 120 can assign the asymmetrical clock cycles to different stages of the pipeline based on the categories of the stages to optimize a utilization of clock cycles by the pipeline. For example, processor 120 can assign a first clock cycle (e.g., short clock cycle) to trigger operations of stages categorized as the first delay stage, and assign a second clock cycle (e.g., long clock cycle) to trigger operations of stages categorized as the second delay stage.

Figure 2:
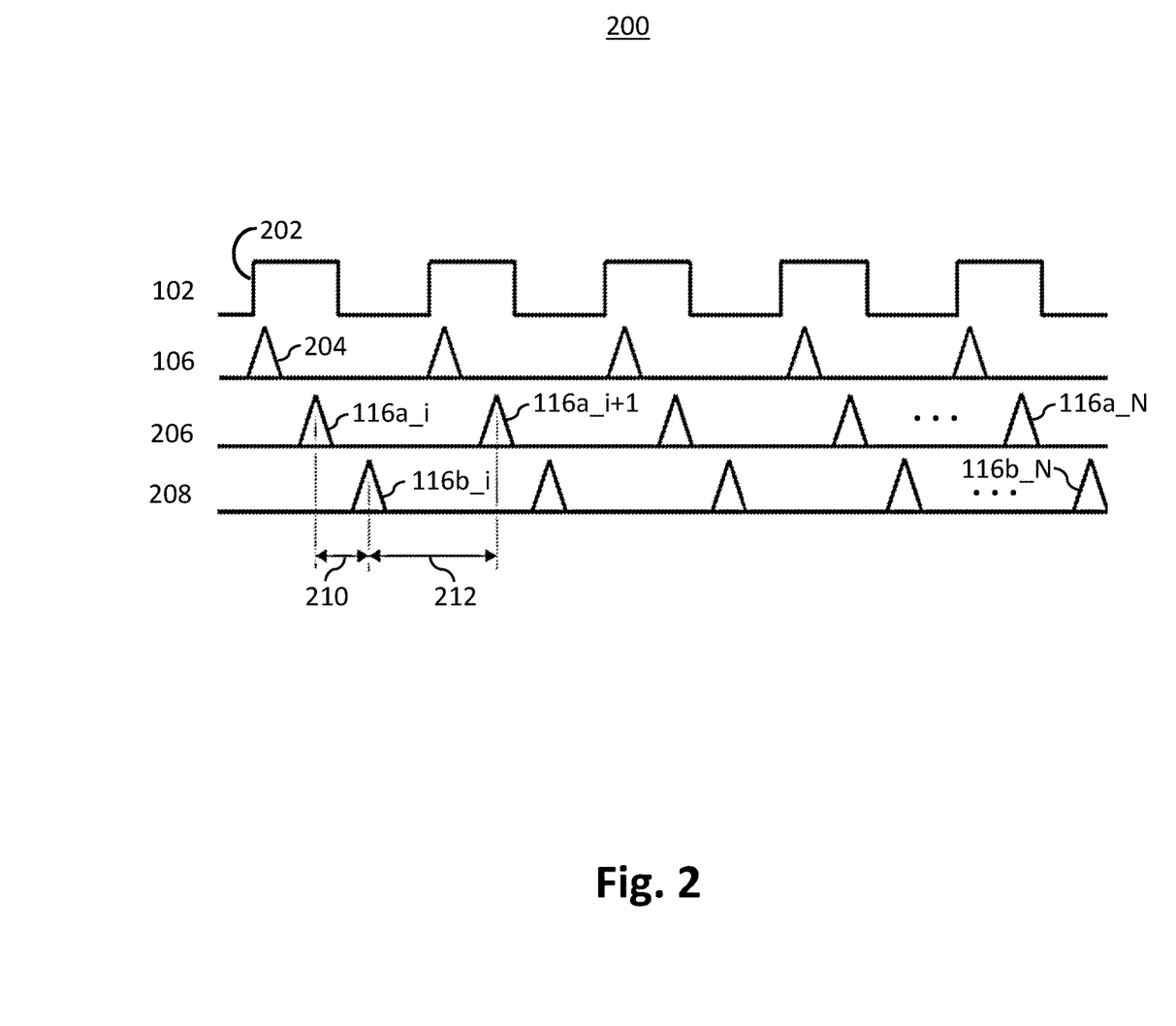
FIG. 2 is a diagram illustrating a timing diagram relating to asymmetrical clock separation and stage delay optimization in SFQ logic in one embodiment.

FIG. 2 is a diagram illustrating a timing diagram 200 relating to asymmetrical clock separation and stage delay optimization in SFQ logic in one embodiment. The below description of FIG. 2 can refer to components shown in FIG. 1. Timing diagram 200 in FIG. 2 shows waveforms of DC signal 102, base clock signal 106, and SFQ clock signals 116a_N and 116b_N (see FIG. 1). DC signal 102 can include a plurality of pulses 202. Base clock signal 106 can include a plurality of SFQ voltage pulses 204. SFQ voltage pulses 204 can be aligned with rising edge of pulses 202. SFQ clock signal 116a_N can include a plurality of SFQ voltage pulses 206. SFQ clock signal 116b_N can include a plurality of SFQ voltage pulses 208.

Processor 120 (see FIG. 1) can receive SFQ clock signals 116a_N and 116b_N from integrated circuit 110. Processor 120 can define different clock cycles based on the SFQ voltage pulses 206, 208 from SFQ clock signals 116a_N and 116b_N. For example, processor 120 can use SFQ voltage pulses 206, 208 as one set of SFQ clock signals 116a_N and 116b_N, and supply these clock signals as clock input to the gates in consecutive stages of a processing pipeline being implemented by processor 120. In one embodiment, processor 120 can define a first clock cycle 210 (e.g., which can also be referred to as a short clock cycle) based on the determined delay, and a second clock cycle 212 (e.g., which can also be referred to as a long clock cycle) based on the determined delay and frequency. As shown in FIG. 2, a duration of first clock cycle 210 can be a period (delay) from a clock pulse on 116a_i to the next nearest clock pulse on 116b_i, where i=1, 2, ..., N. A duration of the second clock cycle 212 can be a period from a clock pulse on 116b_i to the next nearest clock pulse on 116a_i+1 (i=1, 2, ..., N) which is equivalent to a period one cycle of 116a_N or 116b_N (which is reciprocal number of their frequency) minus first clock cycle 210. Processor 120 can be configured to determine that the second clock cycle 212 has a period greater than a period of first clock cycle 210. Processor 120 can define first clock cycle 210 and second clock cycle 212 with each pair of SFQ clock signal 116a_i and 116b_i received from integrated circuit 110 (see FIG. 1) and assign these two clocks to the clock signals of the gates in consecutive stages of a processing pipeline being implemented by processor 120. For example, if N=32, integrated circuit 110 can output 32 pairs of SFQ clock signals 116 (e.g., from 116a_1, 116b_1 to 116a_32, 116b_32, respectively), which is a total of 64 individual SFQ clock signals 116. If processor 120 is implementing a processing pipeline having 64 pipeline stages, each one of the 64 pipeline stages can receive one individual SFQ clock signal among SFQ clock signals 116a_1 to 116a_32 and 116b_1 to 116b_32. The assignment of SFQ clock signals 116 to individual processing pipeline stages can maintain an entire operation latency consistent to external blocks because the sum of the two clock cycles 210, 212 are constant and is the same as one cycle of any one of the clock signals 102, 106, 106a_i, 106b_i.

In one or more embodiment, if the first and second delay stages (e.g., the short and long delay stages, respectively) has considerably small delay compared with the first clock cycle (e.g., the short clock cycle), processor 120 can arbitrarily assign either one of the first clock cycle or the second clock cycle to stages, regardless of whether the stages are first delay stages or second delay stages. In another embodiment, a frequency of base clock signal 106 can be increased such that cycles of the base clock signal 106 can be decreased until either the first clock cycle or the second clock cycle is comparable or sufficiently close to be equivalent to either the delay of the first delay stages or the delay of the second delay stages.

Figure 3A:
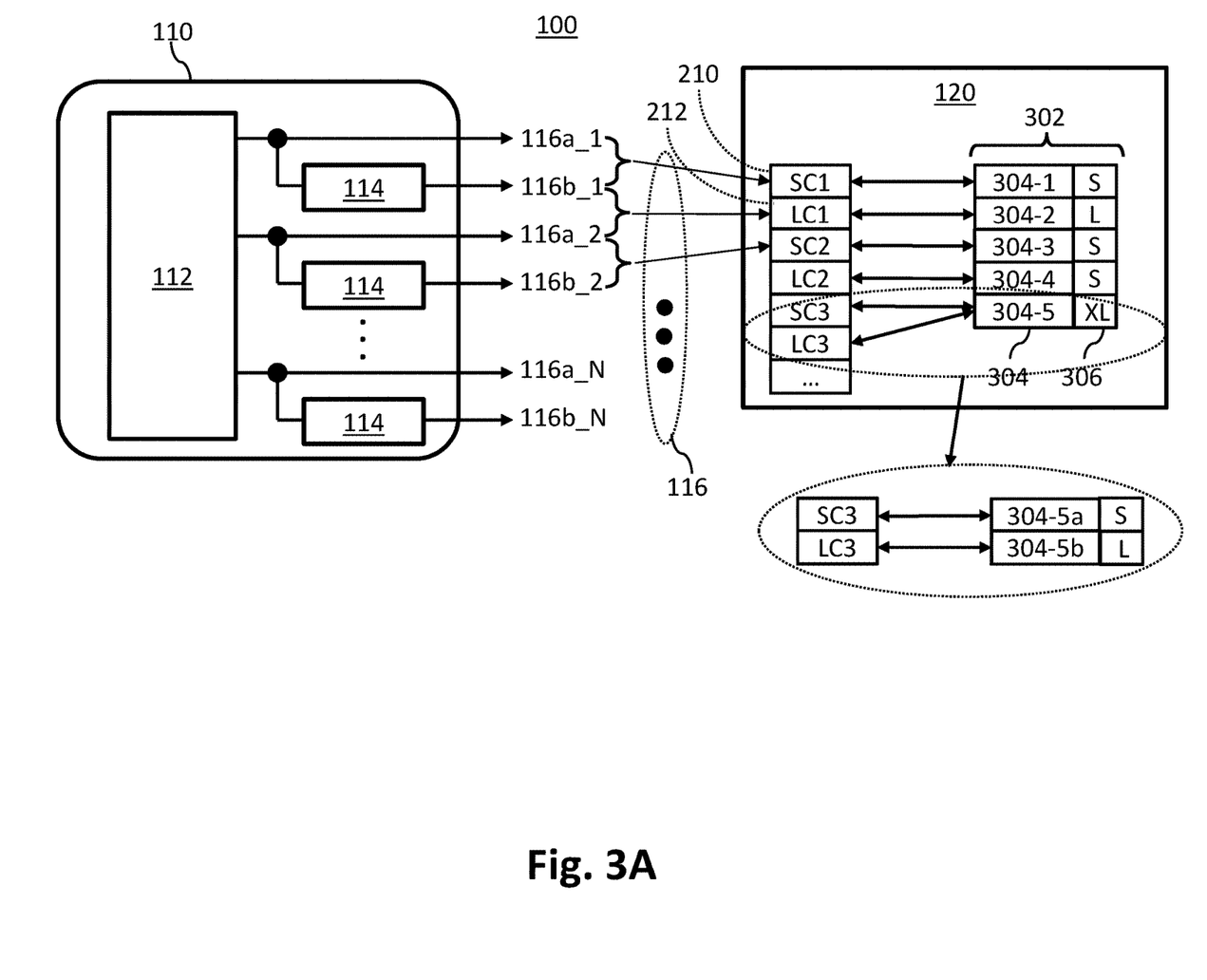
FIG. 3A is a diagram illustrating assignment of a set of asymmetrical clock cycles to a plurality of SFQ pipeline stages in one embodiment.

FIG. 3A is a diagram illustrating assignment of asymmetrical clock cycles to a plurality of SFQ pipeline stages in one embodiment. In response to defining a first clock cycle 210 (short cycle denoted as "SC" in FIG. 3) and a second clock cycle 212 (long cycle defined as "LC" in FIG. 3) from each SFQ signals 116, processor 120 can assign the defined short and long clock cycles to different stages (e.g., alternate stages) of a processing pipeline ("pipeline") being implemented by processor 120. In the example shown in FIG. 3, a pipeline 302 includes a plurality of stages 304, such as stage 304-1 to stage 304-5. In one embodiment, pipeline 302 can be a gate level pipeline being implemented by a SFQ circuit, including SFQ logic gates, that is a part of processor 120.

Processor 120 can classify or categorize each stage among stages 304 into different delay stages 306. Delay stages 306 can be either a first delay stage (e.g., short delay stage labeled as "S") or a second delay stage (e.g., long delay stage labeled as "L"). In one embodiment, a first delay stage of pipeline 302 can be a stage including relatively simple gate or a gate with relatively short delay. For example, a first delay stage can implement SFQ logic gates that has no more than two input terminals (e.g., 2-to-1 AND gate, 2-to-1 OR GATE, an inverter, etc.). A second delay stage of pipeline 302 can be a stage including relatively complex gate, or a gate with relatively long delay, or a combination of considerably simple and complex gates. For example, a second delay stage can implement SFQ logic gates that has more than two input terminals and/or have logic gates followed by long wire line. In one or more embodiments, a stage that writes to and/or read from a register can be considered as a second delay stage if the register write and read takes long period of time. A stage that performs data flow (e.g., transfer data from one block to another block with short data transfer period) can be considered as a first delay stage, and the stage that performs data flow with long data transfer period can be considered as a second delay stage.

In response to categorizing stages 304 of pipeline 302, processor 120 can assign first clock cycle 210 and second clock cycle 212 to the categorized stages. In one embodiment, the clock cycles defined by processor 120 can be aligned alternately, such as SC1, LC1, SC2, LC2, ... as shown in FIG. 3. In the example shown in FIG. 3, pipeline 302 can include five stages 304-1, 304-2, 304-3, 304-4, 304-5. Stages 304-1, 304-3, 304-4 can be assigned to short clock cycles because these stage delays are assigned or classified as first delay stages (e.g., short delay stages) stages, and 304-2 can be assigned or classified as a second delay stage (e.g., long delay stage). The pipeline stage 304-4 can be assigned to long clock cycle even though its stage delay is short. Processor 120 can assign clock cycles to stages 304 in the order of the pipeline 302. For example, processor 120 can start the clock cycle assignment at stage 304-1 and assign a short clock cycle SC1 to stage 304-1 based on stage 304-1 being a first delay stage. Processor 120 can proceed to assign a long clock cycle LC1 to stage 304-2 and assign a short clock cycle SC2 to stage 304-3.

In the example shown in FIG. 3, subsequent to assigning short clock cycle SC2 to stage 304-3, a next clock cycle to be assigned is a long clock cycle LC2 and a next stage to be assigned with a clock cycle is a first delay stage (e.g., short delay stage), which is stage 304-4. Processor 120 can assign clock cycle LC2 to stage 304-4 because long clock cycle LC2 has sufficient time duration to complete stage 304-4 (e.g., delay incurred by stage 304-4 is less than second clock cycle 212). Hence, processor 120 can assign either a first clock cycle 210 or a second clock cycle 212 to a first delay stage (e.g., short delay stage).

Subsequent to assigning long clock cycle LC2 to stage 304-4, a next clock cycle to be assigned is a short clock cycle SC3 and a next stage to be assigned with a clock cycle is stage 304-5. In one embodiment, if pipeline stage 304-5 can be an extra-long delay stage (e.g., longer than a long delay stage, denoted as XL in FIG. 3), processor 120 can divide pipeline stage 304-5 into two individual cycle stages 304-5a and 304-5b. The structure of divided stages 304-5a and 304-5b can be a short stage followed by a long delay stage. Processor 120 can assign the short clock cycle SC3 and the long clock cycle LC3 to the stages 304-5a and 304-5b, respectively. Note that the division of stage 304-5 is asymmetrical, such that stage 304-5a is short enough to process in short clock cycle (SC3) and 304-5b can be longer because it is assigned to long clock cycle (LC3).

By assigning short clock cycles 210 to first delay stages (e.g., short delay stages) and long clock cycles 212 to second delay stages (e.g., long delay stages), an efficiency of pipeline 302 can be improved by reducing unused time. For example, a reduction of short delay stages utilizing long clock cycles can reduce an amount of wait time when tasks of a short delay stage are completed significantly earlier than an end of a long clock cycle, leading to optimized operation speed. The systems and methods described herein can improve processing pipelines implemented by SFQ circuits because SFQ logic gates need clock signals to operate. The systems and methods described herein can also improve processing pipelines implemented by complementary metal-oxide-semiconductor (CMOS) logic especially for fast clock signal with very few combinational gate stages between D-flip Flops (DFFs) or D-Latches (DL) which receive clock signals to operate. For example, the systems and methods described herein can be applied to relatively faster systems, such as 20 gigahertz (GHz) systems, by supplying the asymmetrically separated clock signals to faster operation blocks (e.g., operation blocks that incur relatively smaller delays) instead of having these faster operation blocks use longer cycle clocks to accommodate other slower operation blocks.

Figure 3B:
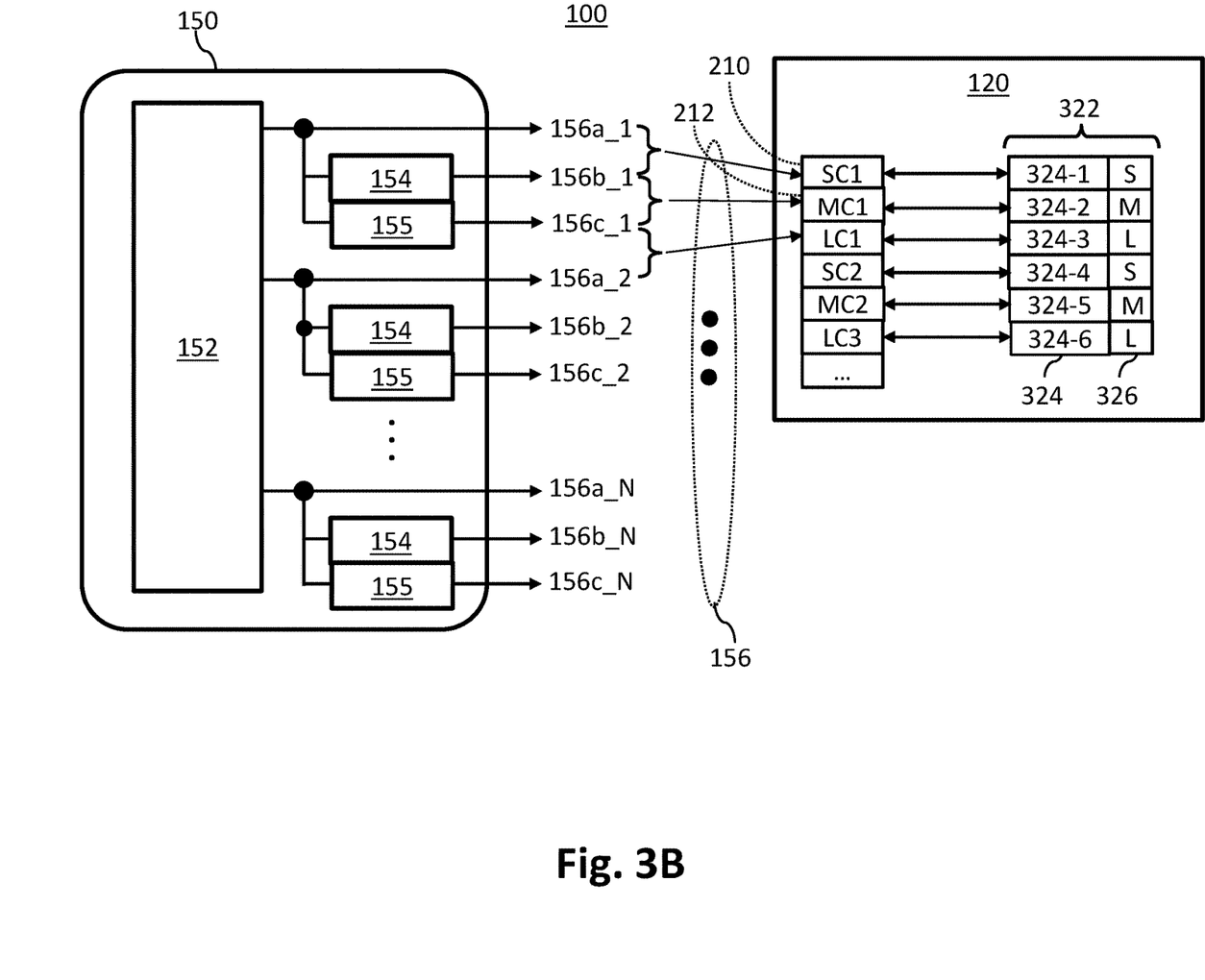
FIG. 3B is a diagram illustrating assignment of another set of asymmetrical clock cycles to a plurality of SFQ pipeline stages in one embodiment.

FIG. 3B is a diagram illustrating assignment of another set of asymmetrical clock cycles to a plurality of SFQ pipeline stages in one embodiment. System 100 can include an integrated circuit 150 that includes a clock drivers and splitters configured to drive and split or divide a base clock signal (e.g., base clock signal 106 in FIG. 1) into a plurality of SFQ clock signals 156. Integrated circuit 150 can include at least one driver, such as a driver 152, configured to receive a base clock signal and output N sets of SFQ clock signals 156, where each set of SFQ clock signal 156 can include three individual SFQ clock signals. The base clock signal received by integrated circuit 150 can undergo a first delay 154 (e.g., JTLs) and a second delay 155 (e.g., JTLs) to split the base clock signal into three SFQ clock signals. The second delay 155 can be a longer delay when compared to the first delay 154. The difference between delays 154 and 155 can result in each set of SFQ click signal 156 to include three individual SFQ clock signals that are out of phase from one another. By having the three SFQ clock signals out of phase with one another, three individual clock cycles can be generated, such as short cycle SCi, middle cycle MCi, and long cycle LCi. In one embodiment, processor 120 can implement a pipeline 322 having pipeline delay stages classified into three different delay stages (e.g., three different lengths of delay), such as short delay stage, medium delay stage and long delay stage. The three different delay stages can be aligned in arbitrary order, such as short-medium long (SML), short-long-medium (SLM), medium-short-long (MSL), and so on. According to the delay stage order, the sets of three SFQ clock cycles 156 can be assigned to the stages of pipeline 322. Note that for each set of three SFQ clock cycles SCi, MCi, and LCi, a sum of SCi, MCi, and LCi is equivalent to the one cycle of the base clock signal received by integrated circuit 150 (e.g., base clock signal 106), thus maintaining external signal interface correctly. In one or more embodiments, the periods of SCi and MCi can be the same, or the periods of MCi and LCi can be same, depending on a desired implementation of system 100.

Figure 4:
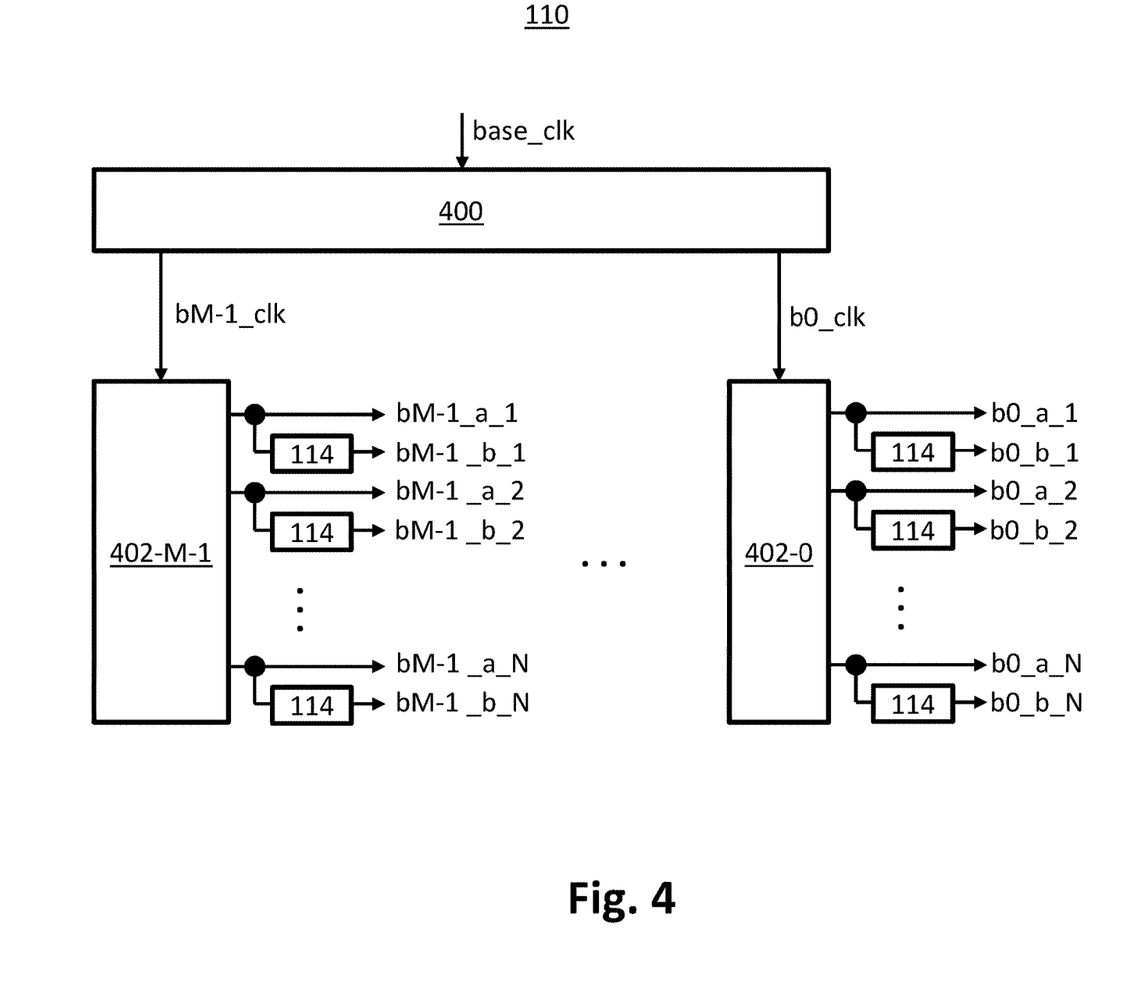
FIG. 4 is a block diagram illustrating an example integrated circuit that can implement asymmetrical clock separation and stage delay optimization in SFQ logic in one embodiment.

FIG. 4 is a block diagram illustrating an example integrated circuit that can implement asymmetrical clock separation and stage delay optimization in SFQ logic in one embodiment. In the example shown in FIG. 4, integrated circuit of FIG. 1 can include a horizontal driver 400 and M vertical drivers 402, ranging from vertical driver 402-0 to 402-M-1. Horizontal driver 400 can be configured to split a base clock signal base_clk (e.g., base clock signal 106 in FIG. 1) into a M intermediate clock signals ranging from b0_clk, b1_clk, . . . , bM-1clk. Each one of the M vertical drivers 402 can be configured to split a corresponding intermediate clock signal into N pairs of SFQ clock signals.

For example, vertical driver 402-0 can split intermediate clock signal b0_clk into N pairs SFQ clock signals, ranging from SFQ clock signal b0_a_1 to b0_a_N. Each one of the M vertical drivers 402-$i$ (where i=0, 1, . . . , M−1) can output its N pairs of SFQ clock signals bi_a_j, bi_b_j (i=0, 1, . . . , M−1; j=1, 2, . . . , N) to processor 120 (see FIG. 1). The example embodiment of integrated circuit 110 in FIG. 4 can be implemented as an asymmetrical clock separator for a multi-bit (M-Bit) pipelined (N-stage) data flow unit implemented in processor 120. In one embodiment, M can be 32 and integrated circuit 110 of FIG. 4 can be implemented to distribute 32 copies of base_clk for a 32-bit adder.

Figure 5A:
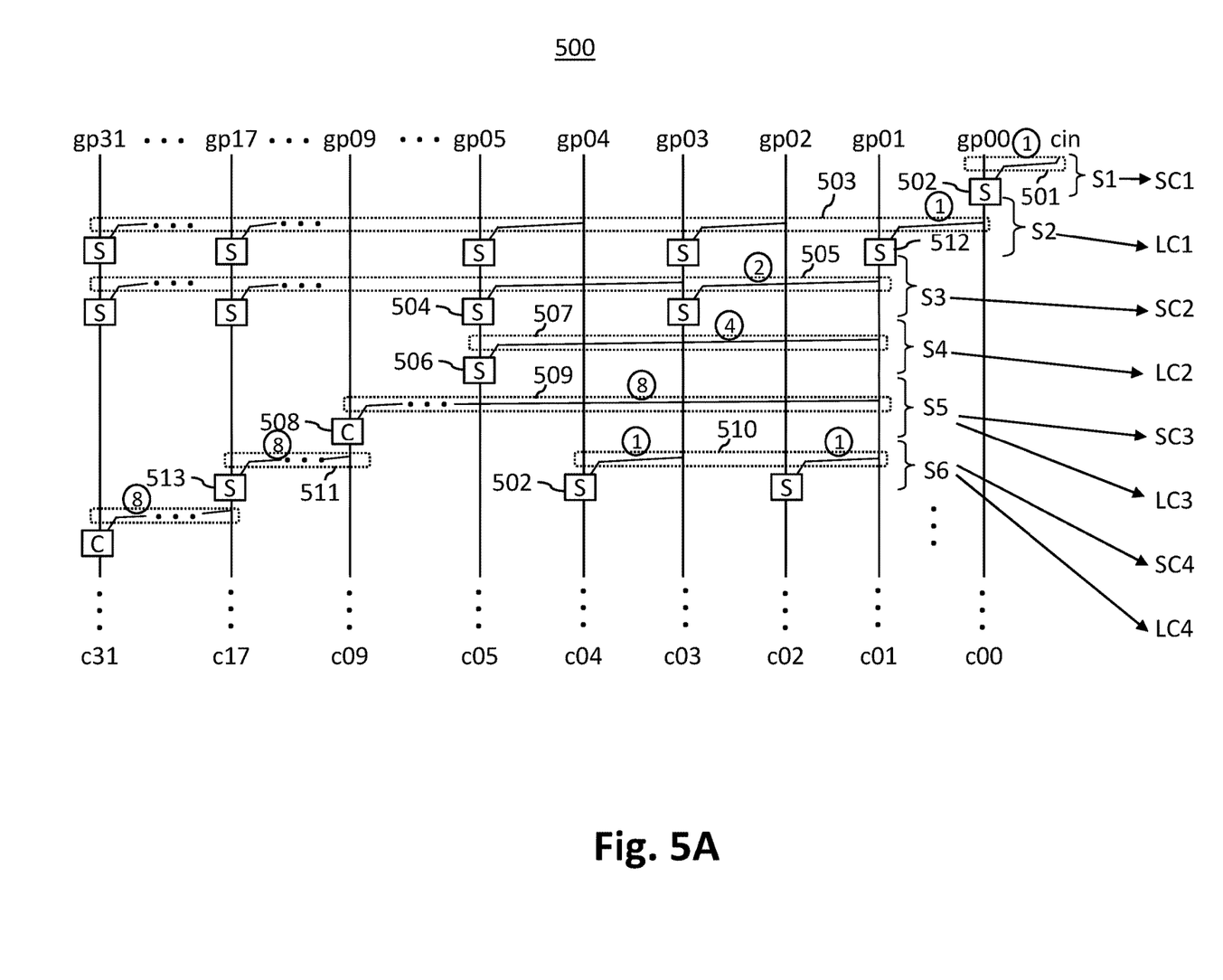
FIG. 5A is a diagram illustrating an example SFQ pipeline with assigned asymmetrical clock cycles in one embodiment.

FIG. 5A is a diagram illustrating an example pipeline with assigned asymmetrical clock cycles in one embodiment. A portion of a pipeline 500 shown in FIG. 5A can be a 32-bit Han-Carlson carry-lookahead adder carry generation path. Pipeline 500 can include 32 carry propagation input data labeled as gp00 to gp31. Final 32-bit carry output data generated from the input data gp00 to gp31 are labeled as c00 to c31. Pipeline 500 can include a plurality of stages S1, S2, S3, S4, S5, S6, and additional stages that are not shown in FIG. 5A. The stages of pipeline 500 can be implemented by carry generation blocks that include logic circuits. For example, in FIG. 5A, a plurality of carry generation gates ("gates") 502, 504, 506, 508, 512, 513, 514, 515 can be implemented by, for example, SFQ logic circuits.

In one embodiment, the gates shown as boxes with labels "S" or "C" shown in FIG. 5A correspond to SFQ gates in a carry generation path. The numbers in the paths (e.g., number label within circles in FIG. 5A) shows length of horizontal (e.g., bit length direction) wires in bit unit. The gates with labels "S" and "C" correspond to SFQ gates that are classified as simple gates ("S") or complex gates ("C"), respectively. Simple gates can be SFQ gates that incur a relatively short delay, and complex gates can be SFQ gates that incur relatively long delay. For example, SFQ gate 502 is simple gate and receives input signal of "cin" with 1-bit-length wire while SFQ gate 508 is complex gate and receives input signal with 8-bit-length wire 509 (from 8-bit right side). Gates 501 and 508 are simple gate and complex gate, respectively. In one embodiment, the stage delay is determined by total sum of the wire delay and the SFQ gate delay. The two parameters or indexes (wire length of input signal and gate complexity in the pipeline path) can be used for categorizing a pipeline stage into short delay stage or long delay stage. At stage S1, SFQ gate 502 can receive an input carry labeled as "cin". A delay of stage S1 can be caused by a wire 501 connecting an input terminal that received "cin" to the gate 502 and gate delay of the gate 502. In this example, wire 501 can have wire length of one bit width, and the gate 502 is simple gate. Thus, the stage S1 can be categorized as a short delay stage. In response to stage S1, a short clock cycle SC1 can be assigned to stage S1.

Stage S2 includes multiple paths from stage S1 to stage S3. In this example, timing critical path includes 1-bit-length wire in 503 and one simple gate 512. Therefore stage S2 can be categorized as a short delay stage. In response to stage S2, a next available clock cycle LC1, where LC1 is a long clock cycle, can be assigned to stage S2. Since the consecutive delay stages have to be assigned clock cycles SC and LC alternately, LC1 can be assigned to S2.

Stage S3 includes multiple paths from stage S2 to stage S4. In this example, timing critical path includes 2-bit-length wire in 505 and one simple gate 504. Therefore, stage S3 can be categorized as a short delay stage. In response to stage S3, a next available clock cycle SC2, where SC2 is a short clock cycle, can be assigned to stage S3.

Stage S4 includes multiple paths from stage S3 to stage S5. In this example, timing critical path includes 4-bit-length wire in 507 and one simple gate 506. Therefore, stage S4 can be categorized as a long delay stage. In response to stage S4, a next available clock cycle LC2, where LC2 is a long clock cycle, can be assigned to stage S4.

Figure 5B:
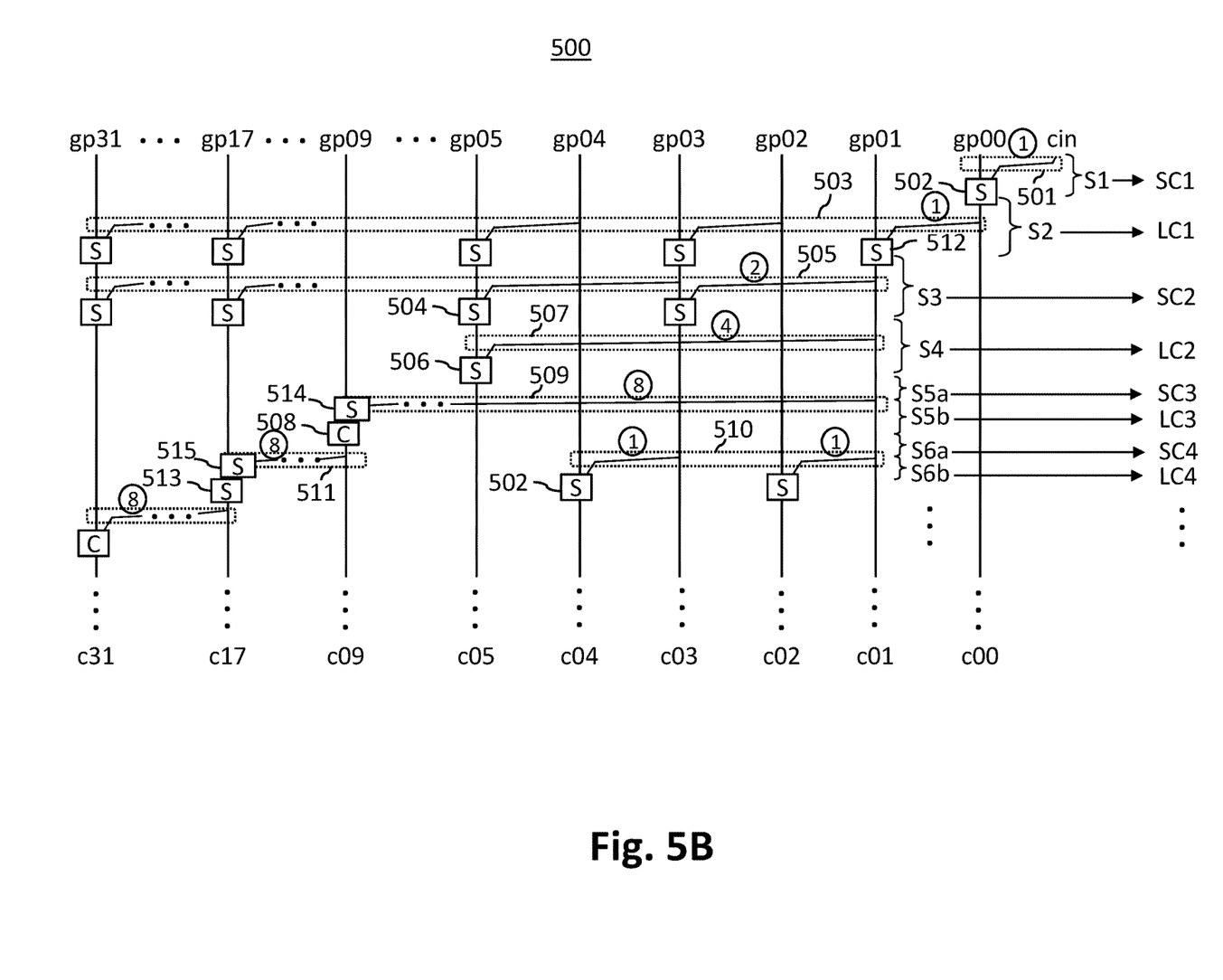
FIG. 5B is a diagram illustrating a portion of the example SFQ pipeline shown in FIG. 5A in one embodiment.

Stage S5 includes multiple paths from stage S4 to stage S6. In this example, timing critical path includes 8-bit-length wire in 509 and one complex gate 508. Therefore, stage S5 can be categorized as an extra-long delay stage which is larger than the second clock cycle. In response to stage S5 being an extra-long delay stage, stage S5 can be divided into two delay stages, S5a and S5b, by inserting simple gates 514 such as DFFs before 508 as shown in FIG. 5B. Then clock cycles SC3 and LC3 can be assigned to S5a and S5b, respectively.

Stage S6 includes multiple paths from stage S5 to stage S7. In this example, timing critical path includes 8-bit-length wire in 511 and one simple gate 513. Therefore, stage S6 can be categorized as a long delay stage. In response to stage S6 being a long delay stage, it is divided into 2 delay stages S6a and S6b by inserting simple gate 515 such as DFFs before 513 as shown in FIG. 5 (b). Then clock cycles SC4 and LC4 are assigned to S6a and S6b, respectively. By assigning short clock cycles to short delay stages and long clock cycles to long delay stages, a performance of pipeline 500 can be improved. For example, assigning stages S1 and S3 to short clock cycles SC1 and SC3, instead of a long clock cycle, can improve an overall speed of pipeline 500.

Figure 6:
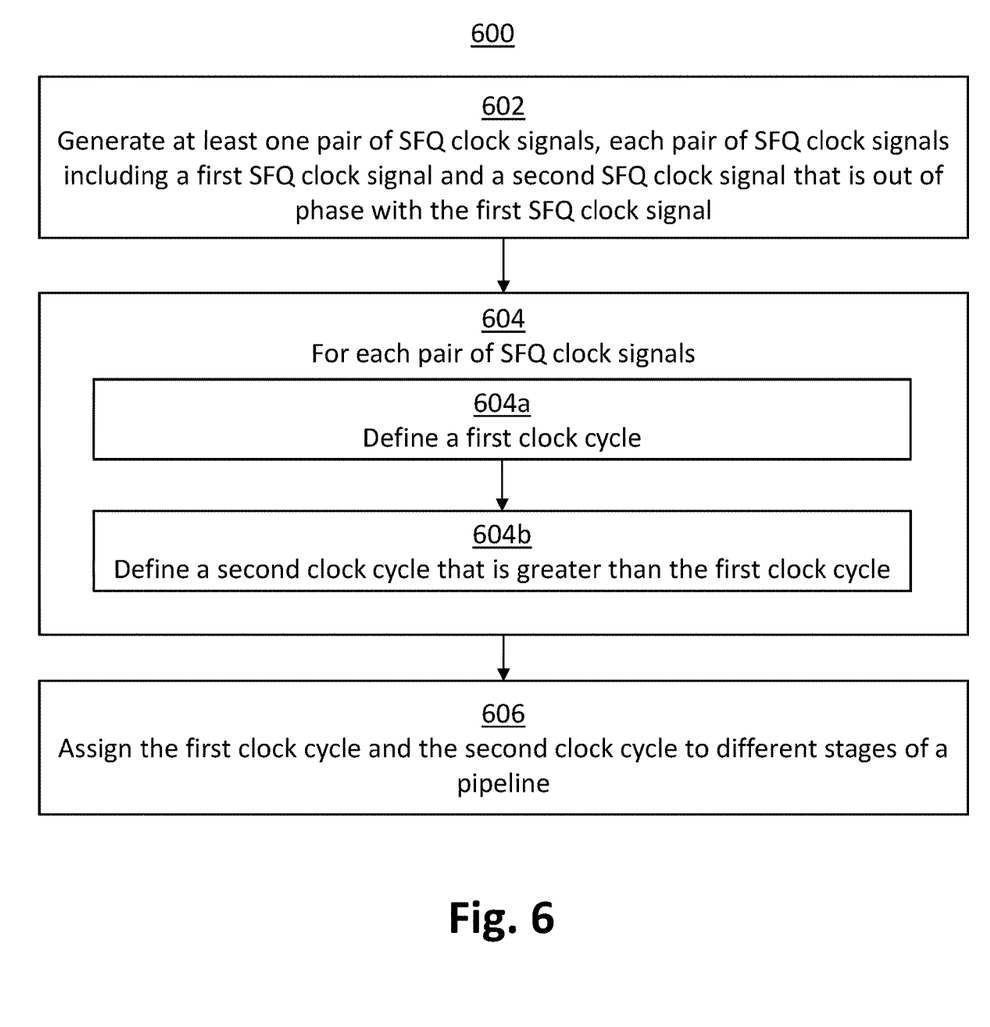
FIG. 6 is a flowchart of an example process that may implement asymmetrical clock separation and stage delay optimization in SFQ logic according to an embodiment of the disclosure.

FIG. 6 is a flowchart of an example process 600 that may implement asymmetrical clock separation and stage delay optimization in SFQ logic according to an embodiment of the disclosure. Example process 600 may include one or more operations, actions, or functions as illustrated by one or more of blocks 602, 604 (including 604a, 604b), and/or 606. Although illustrated as discrete blocks, various blocks can be divided into additional blocks, combined into fewer blocks, eliminated, performed in different order, or performed in parallel, depending on the desired implementation.

Process 600 can be performed by a system, such as system 100 shown in FIG. 1. Process 600 can begin at block 602. At block 602, an integrated circuit of the system can generate at least one pair of SFQ clock signals based on a stream of SFQ pulses. Each pair of SFQ clock signals can includes a first SFQ clock signal and a second SFQ clock signal that is out of phase with the first SFQ clock signal. The second SFQ clock signal can have the same frequency as the first SFQ clock signal.

In one embodiment, the integrated circuit can generate the second SFQ clock signal by applying a delay on the first SFQ clock signal. In one embodiment, the integrated circuit can generate the second SFQ clock signal by applying a delay on the first SFQ clock signal using a Josephson transmission line (JTL). In one embodiment, the integrated circuit can implement an H-tree network to distribute the at least one pair of SFQ clock signals from a root to a leaf of the H-tree network. In one embodiment, the integrated circuit can receive a stream of SFQ pulses from a DC to SFQ converter, and the at least one pair of SFQ clock signals is generated based on the received stream of SFQ pulses.

Process 600 can proceed from block 602 to block 604. At block 604, blocks 604a and 604b can be performed for each pair of SFQ clock signals. At block 604a, a processor configured to be in communication with the integrated circuit can define a first clock cycle based on a delay from the first SFQ clock signal to the second SFQ clock signal. At block 604-b, the processor can define a second clock cycle based on a delay from the second SFQ clock signal to the first SFQ clock signal of a next pair of SFQ clock signals. The second clock cycle can be greater than the first clock cycle.

In one embodiment, a duration of the first clock cycle can be equivalent to a delay from the first SFQ clock signal to the second SFQ clock signal. A duration of the second clock cycle can be equivalent to the delay from the second SFQ clock signal to the first SFQ clock signal of the next pair of SFQ clock signals, and the duration of the second clock cycle is equivalent to a difference between the first clock cycle and a cycle of the SFQ clock signal.

Process 600 can proceed from block 604 to block 606. At block 606, the processor can assign the first clock cycle and the second clock cycle to different stages of a pipeline. The assignment can be based on an amount of delay incurred by the different stages. In one embodiment, the pipeline can be a gate level pipeline being implemented by SFQ logic gates. In one embodiment, the processor can categorize different stages among the pipeline as one of a first delay stage and a second delay stage. The first delay stage can have less delay than the second delay stage. The processor can assign the first clock cycle to the first delay stages and assign the second clock cycle to the second delay stages.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more instructions for implementing the specified logical function(s). In some alternative implementations, the functions noted in the blocks may occur out of the order noted in the Figures. For example, two blocks shown in succession may, in fact, be performed substantially concurrently, or the blocks may sometimes be performed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
a processor configured to:
implement a pipeline;
receive at least one pair of SFQ clock signals, wherein each pair of SFQ clock signals includes:
a first SFQ clock signal;
a second SFQ clock signal that is out of phase with the first SFQ clock signal, wherein the second SFQ clock signal has same frequency as the first SFQ clock signal;
for each pair of SFQ clock signals:
define a first clock cycle based on a delay from the first SFQ clock signal to the second SFQ clock signal;
define a second clock cycle based on a delay from the second SFQ clock signal to the first SFQ clock signal of a next pair of SFQ clock signals, wherein the second clock cycle is greater than the first clock cycle; and
assign the first clock cycle and the second clock cycle to different stages of the pipeline, wherein the assignment is based on delays of the different stages.

2. The system of claim 1, wherein:
a duration of the first clock cycle is equivalent to the delay from the first SFQ clock signal to the second SFQ clock signal; and
a duration of the second clock cycle is equivalent to the delay from the second SFQ clock signal to the first SFQ clock signal of the next pair of SFQ clock signals, and the duration of the second clock cycle is equivalent to a difference between the first clock cycle and a cycle of the SFQ clock signal.

3. The system of claim 1, wherein the processor is configured to categorize the different stages among the pipeline based on the delays of the different stages.

4. The system of claim 3, wherein the processor is configured to:
categorize every stage among the pipeline into one of first delay stage and a second delay stage, wherein the first delay stage has less delay than the second delay stage;
align the first delay stages and the second delay stages alternately in the pipeline,
assign the first clock cycle to the first delay stages; and
assign the second clock cycle to the second delay stages.

5. The system of claim 4, wherein in response to a specific stage being a first delay stage and a next available clock cycle being the second clock cycle, the processor is configured to assign the second clock cycle to the specific stage.

6. The system of claim 4, wherein the processor is configured to:
categorize a specific stage as the first delay stage in response to the specific stage including a number of gate level inputs below a threshold; and
categorize the specific stage as the second delay stage in response to the specific stage including a number of gate level inputs above a threshold.

7. The system of claim 1, wherein the pipeline is a gate level pipeline being implemented by SFQ logic gates among the processor.

8. A method for optimizing a pipeline, the method comprising:
generating at least one pair of SFQ clock signals based on a stream of SFQ pulses, wherein each pair of SFQ clock signals includes:
a first SFQ clock signal;
a second SFQ clock signal that is out of phase with the first SFQ clock signal,
wherein the second SFQ clock signal has same frequency as the first SFQ clock signal; and
for each pair of SFQ clock signals:
defining a first clock cycle based on a delay from the first SFQ clock signal to the second SFQ clock signal;
defining a second clock cycle based on a delay from the second SFQ clock signal to the first SFQ clock signal of a next pair of SFQ clock signals, wherein the second clock cycle is greater than the first clock cycle; and
assigning the first clock cycle and the second clock cycle to different stages of a pipeline, wherein the assignment is based on delays of the different stages.

9. The method of claim 8, further comprising generating the second SFQ clock signal by applying a delay on the first SFQ clock signal.

10. The method of claim 9, wherein generating the second SFQ clock signal comprises applying the delay on the first SFQ clock signal using a Josephson transmission line (JTL).

11. The method of claim 8, wherein the pipeline is a gate level pipeline being implemented by SFQ logic gates.

12. The method of claim 8, wherein:
a duration of the first clock cycle is equivalent to the delay from the first SFQ clock signal to the second SFQ clock signal; and
a duration of the second clock cycle is equivalent to the delay from the second SFQ clock signal to the first SFQ clock signal of the next pair of SFQ clock signals, and the duration of the second clock cycle is equivalent to a difference between the first clock cycle and a cycle of the SFQ clock signal.

13. The method of claim 8, further comprising:
categorizing every stage of the pipeline into one of a first delay stage and a second delay stage, wherein the first delay stage has less delay than the second delay stage;
aligning the first delay stages and the second delay stages alternately in the pipeline,
assigning the first clock cycle to the first delay stages; and
assigning the second clock cycle to the second delay stages.

14. The method of claim 13, wherein in response to a specific stage being a first delay stage and a next available clock cycle being the second clock cycle, the method further comprising assigning the second clock cycle to the specific stage.

15. A system comprising:
a processor configured to implement a pipeline;
an integrated circuit configured to:
receive a stream of single flux quantum (SFQ) pulses;
generate N pairs of SFQ clock signals based on the stream of SFQ pulses, wherein a pair of the N pairs of SFQ clock signals includes:
a first SFQ clock signal that is a copy of the stream of SFQ pulses, wherein the N pairs of SFQ signals comprises N first SFQ clock signals that are in-phase;
a second SFQ clock signal that is out of phase with the first SFQ clock signal, wherein the second SFQ clock signal has same frequency as the first SFQ clock signal, and the N pairs of SFQ signals comprises N second SFQ clock signals that are in-phase; and output concurrently at least one pair of the N pairs of SFQ clock signals to the processor;

the processor being further configured to:

receive the at least one pair of the N pairs of SFQ clock signals from the integrated circuit;

for each pair of SFQ clock signals:

define a first clock cycle based on a delay from the first SFQ clock signal to the second SFQ clock signal;

define a second clock cycle based on a delay from the second SFQ clock signal to the first SFQ clock signal of a next pair of SFQ clock signals, wherein the second clock cycle is greater than the first clock cycle; and assign the first clock cycle and the second clock cycle to different stages of the pipeline, wherein the assignment is based on delays of the different stages.

16. The apparatus of claim 15, wherein the integrated circuit is configured to generate the second SFQ clock signal by applying a delay on the first SFQ clock signal.

17. The apparatus of claim 16, wherein the integrated circuit comprises at least one Josephson transmission line (JTL) that applies the delay on the first SFQ clock signal to generate the second SFQ clock signal.

18. The apparatus of claim 15, wherein the stream of SFQ pulses is received from a DC to SFQ converter.

19. The apparatus of claim 15, wherein the integrated circuit implements a H-tree network to distribute the at least one pair of the N pairs of SFQ clock signal based on the stream of SFQ pulses from a root to a leaf of the H-tree network.

20. The apparatus of claim 15, wherein the pipeline is a gate level pipeline being implemented by SFQ logic gates in the processor.

* * * * *